(12) United States Patent
Schweitzer, III et al.

(10) Patent No.: US 11,056,082 B1
(45) Date of Patent: Jul. 6, 2021

(54) WATERFALL DISPLAY FOR HIGH-SPEED STREAMING MEASUREMENTS

(71) Applicant: Schweitzer Engineering Laboratories, Inc., Pullman, WA (US)

(72) Inventors: Edmund O. Schweitzer, III, Pullman, WA (US); David E. Whitehead, Pullman, WA (US); David J. Casebolt, Moscow, ID (US); Krishnanjan Gubba Ravikumar, Pullman, WA (US); Austin Edward Wade, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/035,979

(22) Filed: Sep. 29, 2020

(51) Int. Cl.
*G09G 5/34* (2006.01)
*G09G 5/30* (2006.01)
(Continued)

(52) U.S. Cl.
CPC ............... *G09G 5/34* (2013.01); *G01R 13/02* (2013.01); *G06T 11/20* (2013.01); *G09G 5/30* (2013.01); *H02H 1/0007* (2013.01); *H02H 1/0092* (2013.01); *H02H 3/04* (2013.01); *H02H 3/08* (2013.01); *G09G 2354/00* (2013.01)

(58) Field of Classification Search
CPC . G06T 11/206; H04L 12/2458; G01R 13/345; G01R 13/20; G01R 13/0227; G01R 13/22; G09G 5/222; G09G 1/162; G06F 3/04845; G06F 3/0481; G06F 17/246; G06Q 40/04; G06Q 10/10; G06Q 30/06
See application file for complete search history.

(56) References Cited

U.S. PATENT DOCUMENTS

| 6,396,279 B1 | 5/2002 | Gruenert |
| 6,493,868 B1 * | 12/2002 | DaSilva ................... G06F 8/20 345/1.3 |

(Continued)

OTHER PUBLICATIONS

David Costello: Understanding and Analyzing Event Report Information, Oct. 2000.

(Continued)

*Primary Examiner* — Todd Buttram
(74) *Attorney, Agent, or Firm* — Jared L. Cherry (57) ABSTRACT

The present disclosure pertains to systems and methods for generating a waterfall display to display a stream of high-speed data measurements. In one embodiment, a system may comprise a communication subsystem to receive a stream of high-speed data measurements. A waterfall generation subsystem may receive the stream of high-speed data measurements from the communication subsystem and identify a plurality of changes in the stream of high-speed data. A subset of data measurements may be selected that includes changes in the high-speed data. The changes may be highlighted through a plurality of modifications. A representation of the subset of data measurements in which changes are highlighted may be generated and presented at a rate below a perception threshold of a human operator. A waterfall display subsystem may generate a human-perceptible waterfall display to represent the stream of high-speed data measurements and the plurality of modifications.

20 Claims, 5 Drawing Sheets

(51) Int. Cl.
*G06T 11/20* (2006.01)
*G01R 13/02* (2006.01)
*H02H 3/04* (2006.01)
*H02H 3/08* (2006.01)
*H02H 1/00* (2006.01)

(56) References Cited

U.S. PATENT DOCUMENTS

| | | |
|---|---|---|
| 6,608,493 B2 | 8/2003 | Hensler |
| 6,795,789 B2 | 9/2004 | Vandiver |
| 6,847,297 B2 | 1/2005 | Lavoie |
| 6,892,115 B2 | 5/2005 | Berkcan |
| 6,892,145 B2 | 5/2005 | Topka |
| 6,909,942 B2 | 6/2005 | Andarawis |
| 6,985,784 B2 | 1/2006 | Vandevanter |
| 6,999,291 B2 | 2/2006 | Andarawis |
| 7,012,421 B2 | 3/2006 | Lavoie |
| 7,043,340 B2 | 5/2006 | Papallo |
| 7,058,481 B2 | 6/2006 | Jiang |
| 7,058,482 B2 | 6/2006 | Fletcher |
| 7,068,483 B2 | 6/2006 | Papallo |
| 7,068,612 B2 | 6/2006 | Berkcan |
| 7,111,195 B2 | 9/2006 | Berkcan |
| 7,117,105 B2 | 10/2006 | Premerlani |
| 7,151,329 B2 | 12/2006 | Andarawis |
| 7,254,001 B2 | 8/2007 | Papallo |
| 7,259,565 B2 | 8/2007 | Diercks |
| 7,262,943 B2 | 8/2007 | Stellato |
| 7,301,738 B2 | 11/2007 | Pearlman |
| 7,460,590 B2 | 12/2008 | Lee |
| 7,532,955 B2 | 5/2009 | Dougherty |
| 7,636,616 B2 | 12/2009 | Fletcher |
| 7,693,607 B2 | 4/2010 | Kasztenny |
| 7,747,354 B2 | 6/2010 | Papallo |
| 7,747,356 B2 | 6/2010 | Andarawis |
| 7,986,503 B2 | 7/2011 | Papallo |
| 8,024,494 B2 | 10/2011 | Soed |
| 8,213,144 B2 | 7/2012 | Papallo |
| 8,560,255 B2 | 10/2013 | Elwarry |
| 8,891,963 B2 | 11/2014 | Patel |
| 9,366,711 B2 | 6/2016 | Klapper |
| 9,632,147 B2 | 4/2017 | Hensler |
| 9,819,611 B2 | 11/2017 | Snowdon |
| 10,178,047 B2 | 1/2019 | Chapman |
| 10,180,451 B2 * | 1/2019 | Schweitzer, III ...... G01R 31/11 |
| 10,379,991 B2 | 8/2019 | Yang |
| 2003/0048508 A1 | 3/2003 | Yu |
| 2004/0090864 A1 * | 5/2004 | Larosa ................ G01S 3/802 |
| | | 367/124 |
| 2009/0012728 A1 | 1/2009 | Spanier |
| 2009/0296583 A1 | 12/2009 | Dolezilek |
| 2010/0040068 A1 | 2/2010 | Wimmer |
| 2010/0183298 A1 | 7/2010 | Biegert |
| 2014/0085308 A1 * | 3/2014 | Huang ................ G06F 16/283 |
| | | 345/440.2 |
| 2016/0013632 A1 | 1/2016 | Lloyd |
| 2016/0191163 A1 * | 6/2016 | Preston ............. H04B 10/2575 |
| | | 398/16 |
| 2017/0026291 A1 | 1/2017 | Smith |
| 2017/0288950 A1 | 10/2017 | Manson |
| 2018/0034689 A1 | 2/2018 | Kanabar |
| 2018/0089057 A1 | 3/2018 | Yang |
| 2018/0348267 A1 | 12/2018 | Yang |

OTHER PUBLICATIONS

Joe Perez: A Guide to Digital Fault Recording Event Analysis, 2010.
Considerations for Use of Disturbance Recorders; a Report to the System Protection Subcommittee of the Power System Relaying Committee of the IEEE Power Engineering Society, Dec. 27, 2006.
David Costello: Event Analysis Tutorial, Part 1: Problem Statements 2011.
Jane Starck, Antti Hakala-Ranta, Martin Stefanka, Switchgear Optimization Using IEC 61850-9-2 and Non-Conventional Measurements May 23, 2012.
Will Allen, Tony Lee: Flexible High-Speed Load Shedding Using a Crosspoint Switch Oct. 2005.
Qiaoyin Yang, Rhett Smith: Improve Protection Communications Network Reliability Throught Software-Defined Process Bus, Jan. 2018.
Caitlin Martin, Steven Chase, Thanh-Xuan Nguyen, Dereje Jada Hawaz, Jeff Pope, Casper Labuschagne: Bus Protection Considerations for Various Bus Types; Oct. 2013.

* cited by examiner

Feeder Relay Waterfall

| Trip | 50 | 51 | LOP | 52A | WB | WB | Time |
|---|---|---|---|---|---|---|---|
| 1 | 0 | 1 | 0 | 0 | 0 | 0 | 02:05.0355 |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | |
| 1 | 0 | 1 | 0 | 1 | 0 | 0 | 02:05.0000 |
| 0 | 0 | 0 | 0 | 1 | 0 | 0 | |
| 0 | 0 | 0 | 0 | 1 | 0 | 0 | |
| 0 | 0 | 0 | 0 | 1 | 0 | 0 | |
| 0 | 0 | 0 | 0 | 1 | 0 | 0 | |
| | | | | | | | CLEAR |

| WB | WB | WB | WB | Time |
|---|---|---|---|---|
| 0 | 0 | 1 | 0 | |
| 0 | 0 | 1 | 0 | |
| 0 | 0 | 1 | 0 | |
| 0 | 0 | 1 | 0 | |
| 0 | 0 | 1 | 0 | |
| 0 | 0 | 1 | 0 | |
| 0 | 0 | 1 | 0 | |
| 0 | 0 | 1 | 0 | |
| 0 | 0 | 1 | 0 | |
| 0 | 0 | 1 | 0 | |
| 0 | 0 | 1 | 0 | |
| ... | ... | ... | ... | |
| 1 | 0 | 1 | 0 | 02:03.0000 |
| 0 | 0 | 1 | 0 | 02:03.0950 |
| 1 | 0 | 1 | 0 | 02:02.7850 |
| | | | | CLEAR |

WATERFALL DISPLAY FOR HIGH-SPEED STREAMING MEASUREMENTS

TECHNICAL FIELD

This disclosure relates to systems and methods for generating a waterfall display for high-speed measurements. The present disclosure may be applied used in a variety of applications where high-speed measurements are analyzed, including but not limited to electric power systems.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Measurement devices have tended toward higher and higher speed over time. For example, electrical power system equipment may generate one million or more samples per second. While higher speed measurements provide a variety of advantages, the quantity of data can be difficult for human operators to process and interpret. In the past, operators of electrical power systems have reviewed streaming data values for a variety of purposes, including commissioning, troubleshooting, maintenance, and verification. Where data sampling rates exceed an operator's perception rate, such techniques lose effectiveness.

High-speed sampling may allow systems to react quickly to changes; however, much of the resulting measurements are redundant. For example, an electric power system measuring a current flowing through a conductor at a rate of one million samples per second may be able to identify the fault and implement a protective action within microseconds. An operator observing a stream of measurements associated with the fault, however, may not be able to perceive the changes in the measurements indicative of the fault or other condition of interest.

The inventors of the present disclosure have recognized that high-speed streaming measurements presented in a manner consistent with the present disclosure may allow operators to review high-speed streaming data and readily identify changes. In various embodiments consistent with the present disclosure, a waterfall display may be used to retain measurement values indicative of a change, while redundant measurements are not retained. In this way, an operator may readily identify measurements associated with changes while assessing a system. Such changes are more likely to be useful than measurements reflecting little or no change from a prior value.

Systems and methods consistent with the present disclosure may reduce or filter high-speed streaming measurements to a speed that is perceptible to users. Human perception is generally limited to perceiving approximately 10 to 12 distinct images per second, while higher display rates are likely to be perceived as motion. Displaying even 10 measurements or groups per second may be challenging for operators seeking to identify changes in data. Accordingly, various systems and methods consistent with the present disclosure may display fewer than 10 measurements or groups of measurements per second.

In various embodiments, a first portion of a display may consecutively display streaming data and a second portion may display retained values associated with changes in the streamed data. In various embodiments, the measurements may be associated with a timestamp to show the time that the measurement occurred. Further, in some embodiments, state changes may be highlighted using, for example, a different color, a different font, underlining, bolding, or any other form of emphasis to facilitate identification of changes.

Various embodiments consistent with the present disclosure may be embodied using a display on the front of a protective relay, as part of a system human-machine interface (HMI), and/or on a physically separate portable device. Portable devices that may be used in systems and methods consistent with the present disclosure include portable computers, laptops, tablets, smartphones, etc. Portable devices may communicate with a protective relay or another element to display streaming data values to be displayed to a user using a variety of communication technologies and protocols. Such technologies include the Internet, a local area network, a virtual private network, a mobile or cellular communication network, IEEE 802.11 standards, Bluetooth, or any other suitable data communication technology or protocol.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

As used herein, an intelligent electronic device (IED) may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. Embedded devices may comprise relatively simple devices to perform a specific function. Such devices may include, for example, contact sensors, status sensors, light sensors, tension sensors, and the like.

Figure 1:
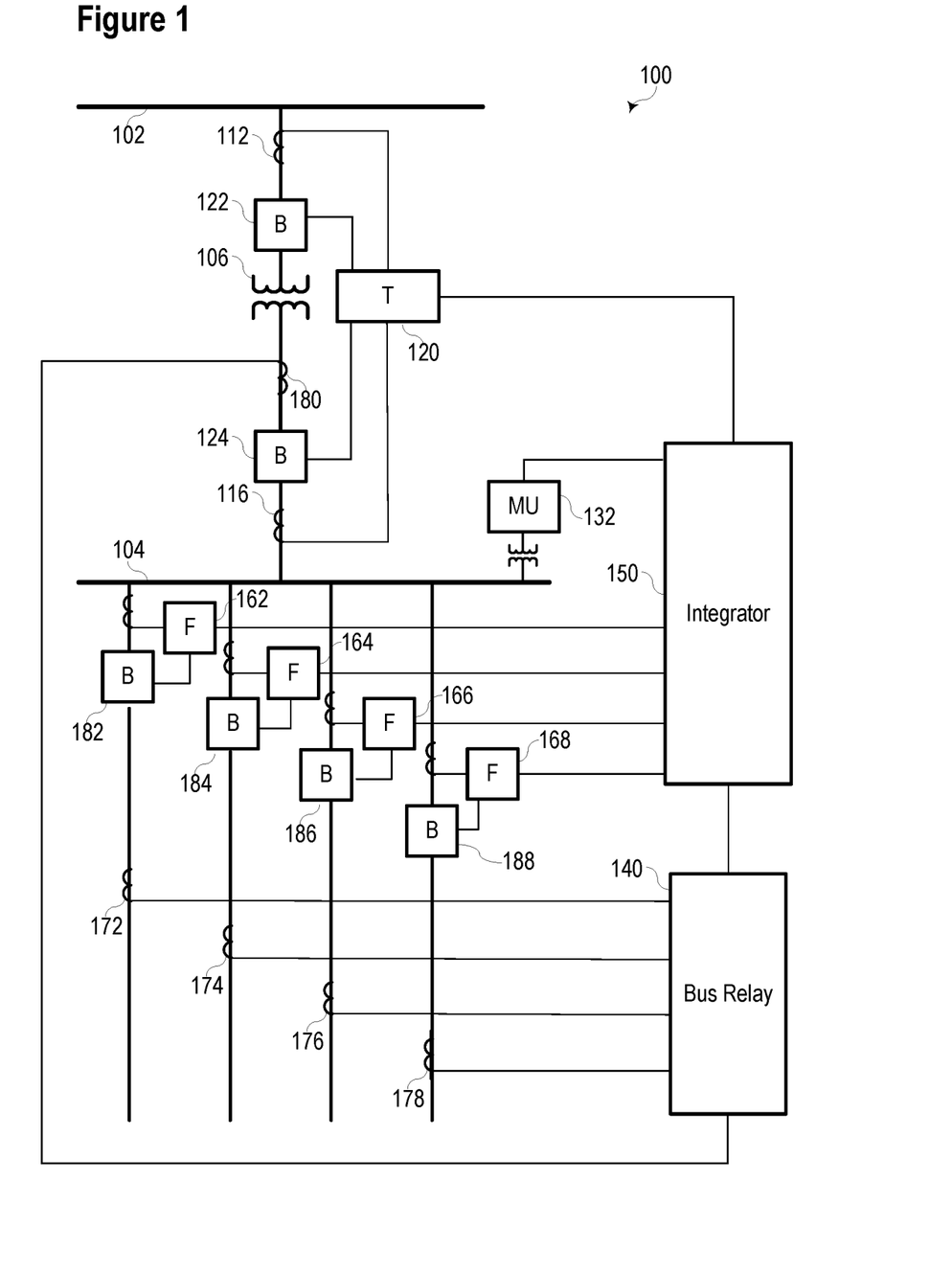
FIG. 1 illustrates a simplified one-line diagram of a portion of an electric power system consistent with embodiments of the present disclosure.

FIG. 1 illustrates a simplified one-line diagram of a portion of an electric power system 100 consistent with embodiments of the present disclosure. A plurality of primary protective relays 120, 140, 162, 164, 166, and 168 automate, monitor, and protect electric power system 100. The primary protective relays 120, 140, 162, 164, 166, 168 are critical infrastructure because maloperation of the relays may interrupt electrical service and/or damage the electric power system 100. Accordingly, stringent security policies may be applied to prevent an unauthorized individual or entity from gaining unauthorized access to or control of primary protective relays 120, 140, 162, 164, 166, and 168.

An integrator 150 may coordinate the operation of various devices in electric power system 100. The integrator 150 may receive information from a variety of devices and may implement consistent security policies across system 100. If the integrator 150 is unavailable or if an operator is working directly with one of the primary protective relays 120, 140, 162, 164, 166, 168, the systems and methods disclosed herein may be utilized to obtain information from one or more of the primary protective relays 120, 140, 162, 164, 166, and 168.

Integrator 150 may provide information to other systems (e.g., a supervisory control and data acquisition ("SCADA") system (not shown), a Wide-Area Situational Awareness ("WASA") system (not shown), and the like. Further, integrator 150 may provide a communication gateway to system 100. Integrator 150 may allow operators to access system 100 locally and/or remotely while enforcing strict security protocols and processes to prevent unauthorized access to primary protective relays 120, 140, 162, 164, 166, and 168.

Electric power system 100 includes equipment, such as a bus 102, which provides electric power to bus 104 via a transformer 106. Transformer 106 may step voltage from a high voltage to a lower voltage. Transformer 106 may be in communication with a merging unit (MU) 132. MU 132 may provide information from transformer 106 to integrator 150 in a format useable by integrator 150. Various feeders extend from bus 104 for delivering electric power to distributed loads. Circuit breakers 122, 124, 182, 184, 186, and 188 may be used to selectively connect and disconnect portions of the electric power system 100 for various purposes such as reconfiguration, protection in the event of a fault, or the like.

A plurality of feeder relays 162, 164, 166, and 168 may obtain current signals from a corresponding plurality of feeders and may provide overcurrent, directional, distance, over frequency, under frequency, and other protection to the feeders. Feeder relays 162, 164, 166, and 168 may provide information to integrator 150.

Transformer relay 120 may protect transformer 106. Transformer relay 120 may obtain current signals from both sides of the transformer 106 using CTs 112 and 116. Transformer relay 120 may provide differential protection, overcurrent protection, over frequency protection, under frequency protection, and other various protection for the transformer 106. Transformer relay 120 may further provide information to integrator 150, including current measurements gathered from CTs 112 and 116.

A bus relay 140 may be an IED configured to determine operating conditions on a zone that includes bus 104 and provide signals to implement a protection scheme. Bus relay 140 may obtain current signals related to electric power entering the bus 104 from integrator 150 or transformer relay 120. Bus relay 140 may also receive signals related to electric power leaving bus 104 on the feeders from CTs 172, 174, 176, 178, and 180. Bus relay 140 may provide differential protection, overvoltage protection, and other types of protection for the zone including the bus 104. Bus relay 140 may provide information to integrator 150.

The relays in system 100 may be in communication with various circuit breakers 122, 124, 182, 184, 186, and 188 to provide signals to the circuit breakers and receive status information from the circuit breakers. Upon receiving an "open" signal, the circuit breakers 122, 124, 182, 184, 186, and 188 may open. For example, upon detection of an overcurrent condition on the first feeder, integrator 150 may signal feeder relay 162 to open breaker 182 to remove current from the faulted feeder. Alternatively, feeder relay 162 may actuate breaker 182 independent of integrator 150.

In various embodiments, integrator 150 may also provide backup protection in the event of a failure. For example, as discussed above, transformer relay 120 may utilize measurements from CTs 112 and 116 to protect transformer 106.

When an operator needs to work with a specific relay or when integrator 150 is unavailable, the operator may use systems and methods consistent with the present disclosure. For example, an operator may need to obtain an event report from feeder relay 162. Using the systems and methods disclosed herein, an operator may use a mobile device to receive information from a wireless unidirectional communication system associated with feeder relay 162. In one specific embodiment, the wireless unidirectional communication system may comprise an infrared transmitter that transmits information to the operator's mobile device.

The primary protective relays 120, 140, 162, 164, 166, 168 may generate measurements of electrical conditions at a high rate (e.g., one million samples per second or greater). At such rates, immense quantities of data are generated that may be difficult for human operators to analyze directly. The systems and methods disclosed herein may be used to facilitate operator review and utilization of real-time data for a variety of purposes (e.g., commissioning, troubleshooting, maintenance, and verification). In various embodiments, integrator 150 may receive real-time data from the primary protective relays 120, 140, 162, 164, 166, 168, and may generate waterfall displays of such data for use by an operator.

Figure 2:
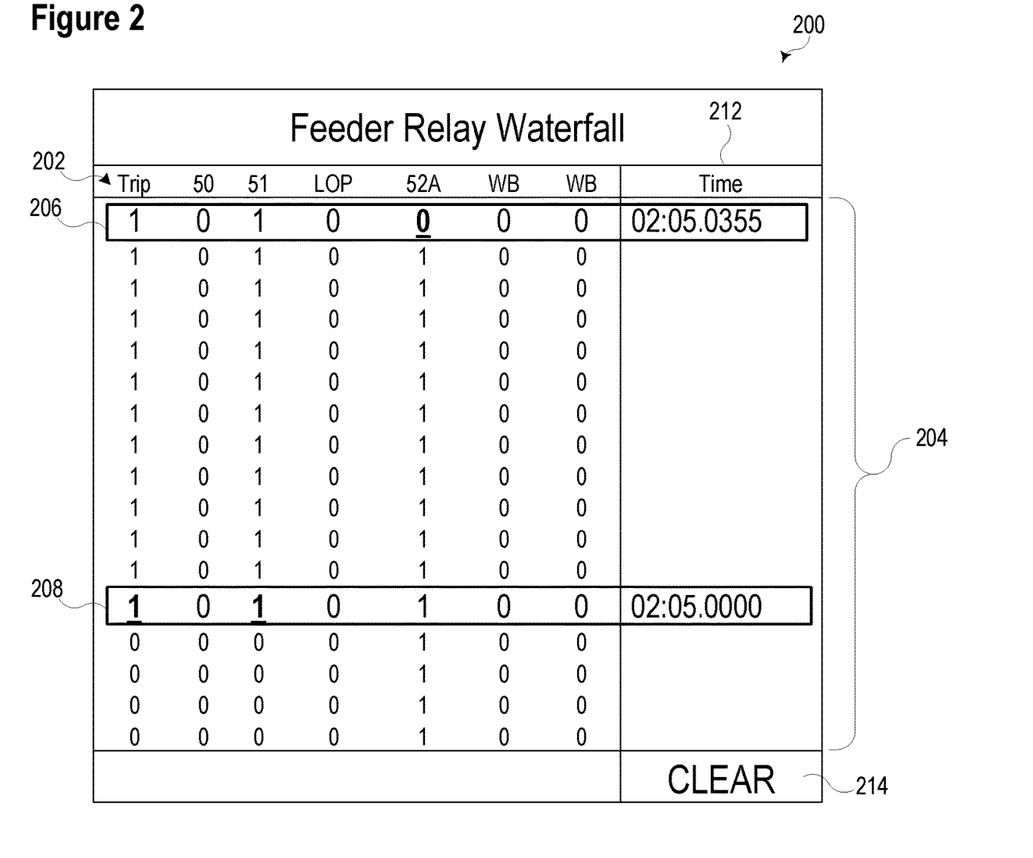
FIG. 2 illustrates a waterfall display consistent with embodiments of the present disclosure.

FIG. 2 illustrates a waterfall display 200 consistent with embodiments of the present disclosure. In the illustrated embodiment, titles 202 may be displayed above a plurality of associated data values 204 over a span of time. The titles 202 may illustrate the status of various relay elements, such as a trip command, an instantaneous-overcurrent relay element (50) time-overcurrent relay element (51), a loss-of-protection (LOP) element, a breaker status element (52A), and two word byte (WB) columns. In some embodiments, the data displayed on the waterfall display 200 may be selected and customized by users.

In the illustrated embodiment, the newest information is displayed at the top of the display 200, and older data moves toward the bottom of the display 200. The oldest set of information may be removed from the bottom of the display 200 and all the entries may be shifted down to accommodate the new information. A timestamp associated with a set of data values may be displayed in a time column 212. In some embodiments, the timestamp may be selectively displayed for only some sets of data values. A clear button 214 may clear the display 200 data values 204.

In the illustrated embodiment, state changes are highlighted to assist users in identifying changes. A variety of techniques may be utilized to highlight changes. In the illustrated embodiment, data sets including changes are highlighted by rectangles 206 and 208 and shown in a larger font. Further, the changed values are bolded and underlined. In other embodiments, changed values may be highlighted using changes in color, font style, underline style, blinking, etc.

Where the sampling rate exceeds a human operator's perception threshold, the rate that information is displayed may be reduced or limited to measurements that show changes. In some embodiments, a system may display only a subset of the measured data (e.g., 1 measured value out of 500,000 measured values may be displayed) if the measured values are unchanged. In such embodiments, changed values may be immediately displayed so that a user can identify the change. In other embodiments, the waterfall display 200 may scroll through data while the data remains unchanged; however, upon the occurrence of a change, the scrolling may pause or stop so that the change is more likely to be perceived by an operator. Reducing the amount of information on the display may allow operators to monitor real-time conditions or near real-time conditions without overwhelming the operators with redundant data.

Figure 3:
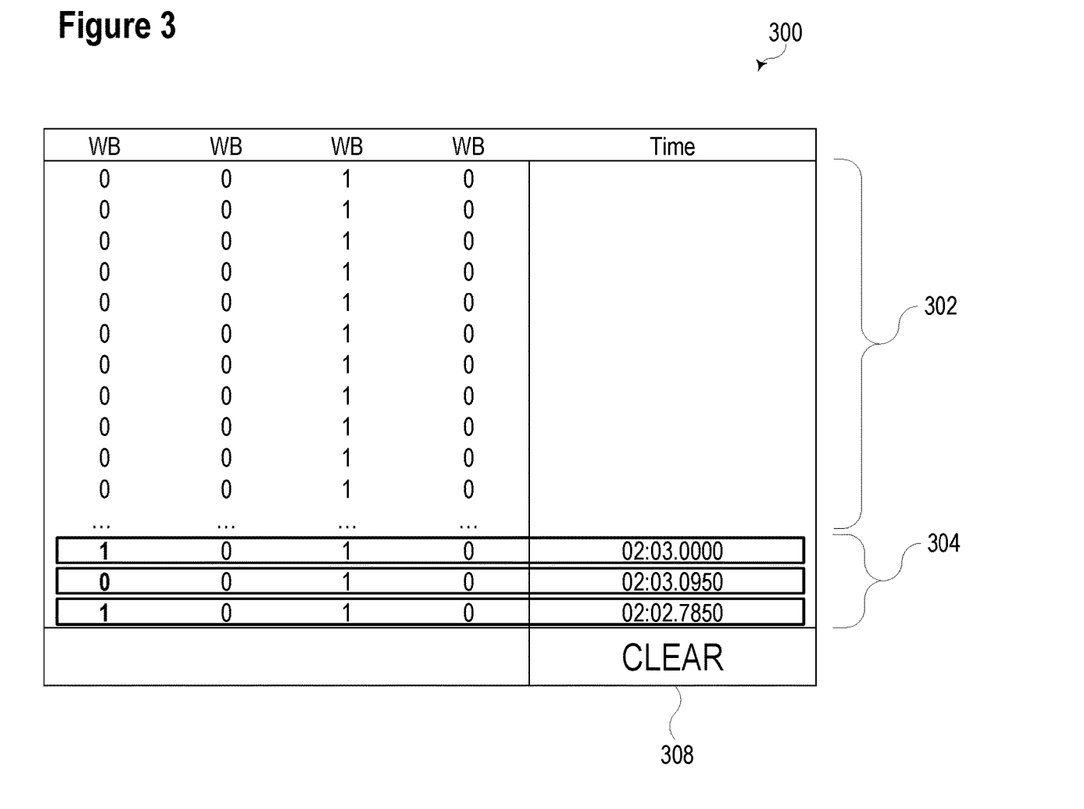
FIG. 3 illustrates a waterfall display that includes a portion of a display that includes a first portion comprising a scrolling display of a waterfall display and a second portion comprising a plurality of entries representing state changes consistent with embodiments of the present disclosure.

FIG. 3 illustrates a waterfall display 300 that includes a portion of a display that includes a first portion 302 comprising a scrolling display of a waterfall display and a second portion 304 comprising a plurality of entries representing state changes consistent with embodiments of the present disclosure. In the illustrated embodiment, the newest information is displayed at the top of the first portion 302 of waterfall display 300, and older data moves toward the bottom of the display 300.

In the second portion 304 of waterfall display 300, data values reflecting state changes may be retained. The state changes may remain on the display until an operator presses a button 308 to clear the changes from the screen. If more than a specified amount of stacked state changes are displayed in the second portion 304 of the waterfall display, the oldest values may be removed to make room for newer values. Changes in data values may be highlighted (e.g., underlined, bolded, enclosed by a rectangle, blinked, etc.) to facilitate identification of the changed values in either the first portion 302 or the second portion 304 of the waterfall display 300.

Figure 4:
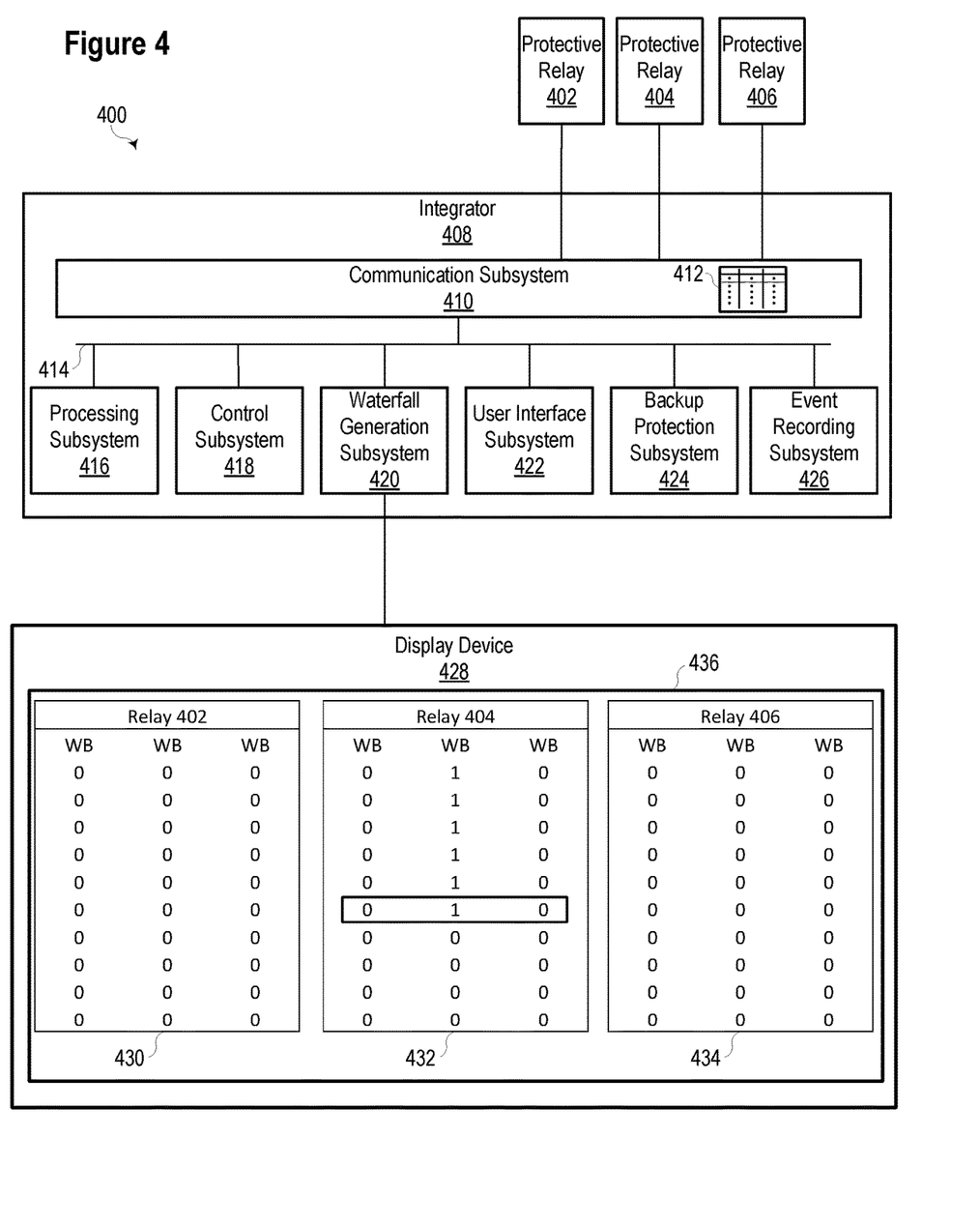
FIG. 4 illustrates a simplified block diagram of a system to generate a waterfall display consistent with embodiments of the present disclosure.

FIG. 4 illustrates a simplified block diagram of a system 400 to generate a waterfall display consistent with embodiments of the present disclosure. In the illustrated embodiment, a plurality of protective relays 402, 404, and 406 are in communication with an integrator 408. Integrator 400 may operate as described above in connection with integrator 150 illustrated in FIG. 1.

Integrator 408 includes a communication subsystem 410 to manage communications among various components of system 400. The communication subsystem may include an IO map 412 that selectively identifies elements authorized to communicate. In some embodiments, communications that are not specifically authorized may be blocked. For example, protective relay 402 may be authorized to communicate with protective relay 404, but communications from protective relay 402 to protective relay 406 may be blocked because IO map 412 does not authorize such communications. The communications subsystem 410 may be configured as described herein to facilitate communications among the various primary protection relays 402, 404, 406 using the IO map 412.

In the illustrated embodiment, the integrator 408 includes a variety of subsystems to perform various functions, including a processing subsystem 416, control subsystem 418, a waterfall generation subsystem 420, a user interface subsystem 422, a backup protection subsystem 424, and an event recording subsystem 426. Other functional subsystems may also be included, but are not illustrated for the sake of simplicity, such as a time alignment subsystem, a security subsystem, and the like.

Processing subsystem 416 may implement computer-executable instructions related to various functions performed by integrator 408. The processing subsystem 416 may comprise any processor capable of executing computer instructions including, for example, a computer processor, a microprocessor, an FPGA, or the like, and may be packaged with or be in communication with computer-readable media for storing computer instructions, such as, for example, non-transitory computer-readable memory to store instructions and other information. The processing subsystem 416 may be embodied as one or more processing devices and may comprise various modules, or groups of modules that comprise one or more physical or logical processors.

Control subsystem 418 may provide automation and control over system 400. Control subsystem 418 may implement a variety of functions, such as settings and/or firmware management, maintaining current records of settings and firmware versions for each of the connected primary relays, updating settings on primary relays, updating the firmware of primary relays, and the like.

Waterfall generation subsystem 420 may generate a representation of a waterfall display 436 based on real-time information received from protective relays 402, 404, and 406. Waterfall generation subsystem 420 may identify changes in streaming data values and select data values to display in the waterfall display 436. Waterfall generation subsystem 420 may filter or reduce high-speed measurements to a rate perceptible to users. In some embodiments, a system may display only a subset of the measured data if the measured values are unchanged but may immediately update the waterfall display 436 upon the occurrence of a change. Limiting or reducing the amount of information from the high-speed measurements may allow operators to monitor real-time conditions or near real-time conditions without overwhelming the operators with redundant data.

Waterfall generation subsystem 420 may transmit the representation of the waterfall display 436 to a display device 428. In some embodiments, the display device 428 may comprise a separate physical device in communication with a system that generates the representation of a virtual display. For example, the display device 428 comprises a portable computer, a laptop, a tablet, or a smartphone. The representation of the virtual display may be communicated in various ways. For example, the representation may be transmitted using a data communication channel over a variety of network technologies (e.g., Wi-Fi, Bluetooth, Ethernet, etc.). Alternatively, display device 428 may comprise an external display connected to integrator 408. In still other embodiments, display device 428 may be a part of integrator 408. For example, display device 428 may comprise a built-in display device.

Waterfall display 436 includes a first portion 430 comprising information from relay 402, a second portion 432 comprising information from relay 404, and a third portion 434 comprising information relay 406. Each of the three portions of display 436 may scroll through values for each of the three relays 402, 404, and 406. In the illustrated embodiment, the newest information is displayed at the top of the waterfall display 436 and older data moves toward the bottom of the display. In the illustrated embodiment, changes are highlighted by placing a rectangle over the group of values in which the change occurs. For example, the second portion 432 of the waterfall display 436 includes a rectangular overlay highlighting a state change. Other techniques may also be used to highlight changes in values.

Waterfall generation subsystem 420 may be embodied using a variety of technologies and devices. In various embodiments, waterfall generation subsystem 420 may comprise a dedicated display of various types (e.g., a cathode ray tube, a liquid crystal display, a plasma display, a light-emitting diode display, etc.). In other embodiments, waterfall generation subsystem 420 may communicate information to another device (e.g., a smartphone, tablet, laptop computer, etc.) to display.

User interface subsystem 422 may allow a user to interact with integrator 408, including, among other things, changing or customizing waterfall display 436. The user interface subsystem 422 may allow a user to select the data to be displayed, to select the format in which the data is displayed (e.g., a user may select formats shown in FIG. 2 or 3), to select the speed at which the display is updated, etc.

Backup protection subsystem 424 may provide backup protection for protective relays 402, 404, and 406. The backup protection subsystem 424 may provide protection functions if protective relays 402, 404, and 406 are unavailable. Such functions may include bus protection, feeder protection, transformer protection, and other forms of protection.

An event recording subsystem 426 may record data associated with an event (e.g., state changes, equipment failures, etc.). Event recording may include power system conditions, time, and actions taken. Information recorded by event recording subsystem 426 may provide information to be included in an event report. Such a report may include, among other things, conditions associated with the event, identification of the equipment impacted by the event, etc.

Figure 5:
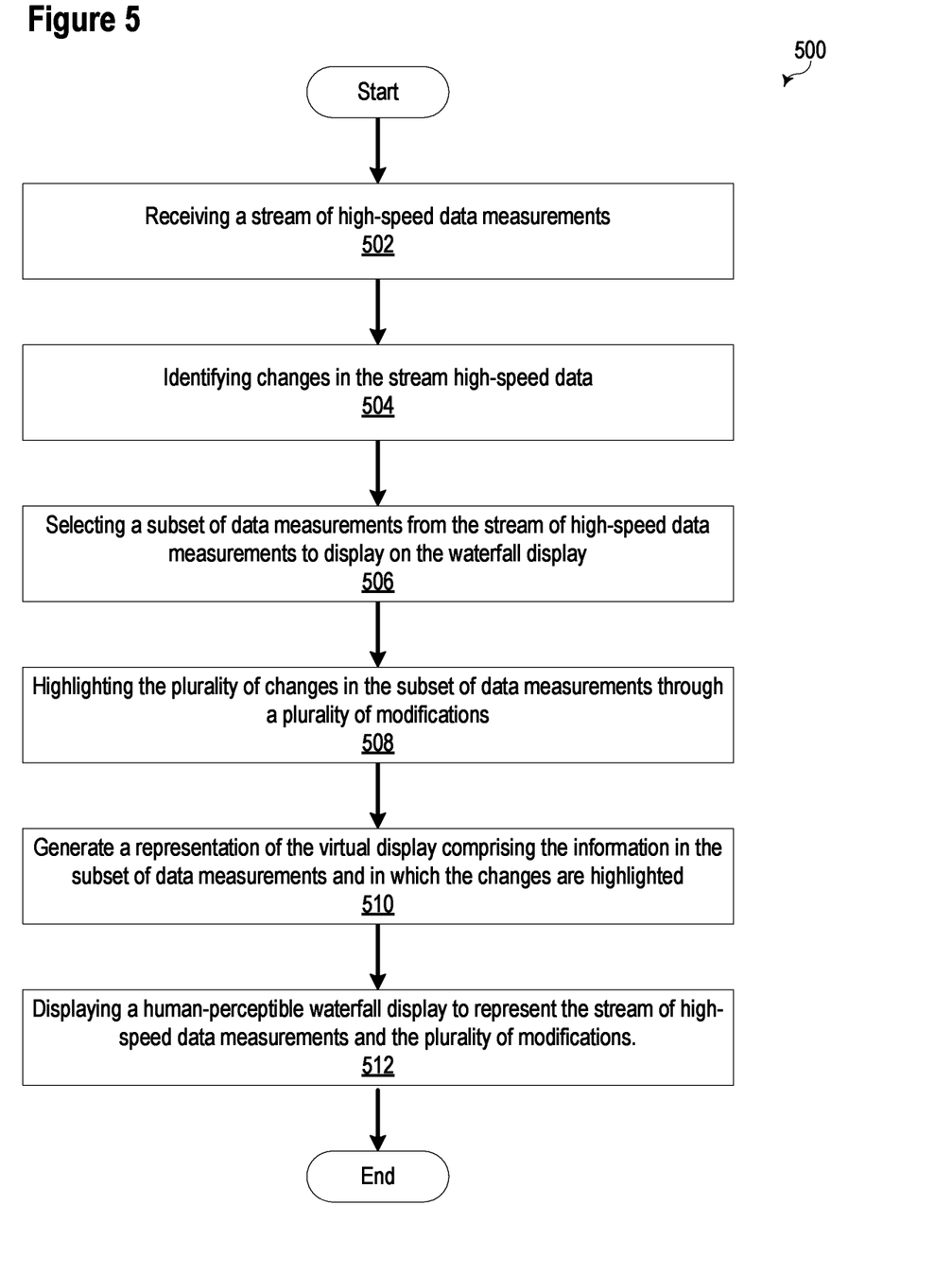
FIG. 5 illustrates a flow chart of a method to generate a waterfall display consistent with embodiments of the present disclosure.

FIG. 5 illustrates a flow chart of a method 500 to generate a waterfall display consistent with embodiments of the present disclosure. At 502, a communication subsystem may receive a stream of high-speed data measurements. The stream of high-speed data measurements may be received from devices in communication with equipment that generates, consolidates, or communicates high-speed measurements. In one embodiment, the communication subsystem may be embodied as communication subsystem 410, as illustrated in FIG. 4.

At 504, changes in the stream of high-speed data may be identified. Such changes are more likely to be useful than measurements reflecting little or no change from a prior value. Identifying such changes may allow method 500 to reduce the speed at which the data is presented to a user without omitting or delaying the presentation of changes that a user may be monitoring.

At 506, a subset of data measurements from the stream of high-speed data measurements may be selected to display on the waterfall display. The subset of data may include the changes identified at 504. Further, the subset may reduce the high-speed data to a quantity that is below a perception threshold of an operator. In some embodiments, the perception threshold may be approximately ten measurements or groups of measurements per second.

At 508, the plurality of changes in the stream of high-speed data may be highlighted through a plurality of modifications. The modifications may be implemented in a variety of ways. For example, the modifications may include altering a font size, a font color, a font style, or other font attributes. The modifications may further comprise adding an overlay to select a change or a group of measurements associated with a change. Rectangles 206 and 208 illustrated in FIG. 2 are examples of overlays consistent with the present disclosure.

At 510, a representation of a virtual display comprising the subset of data measurements in which changes are highlighted may be presented at a rate below a perception threshold of a human operator. In some embodiments, the virtual display may comprise a separate physical device in communication with a system that generates the representation of a virtual display. For example, the representation of the virtual display may be generated by an integrator, such as integrator 408 illustrated in FIG. 4, while the display device comprises a portable computer, a laptop, a tablet, or a smartphone. Alternatively, the display device may be integrated into a system that generates the representation of the virtual display.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to generate a waterfall display, the system comprising:
   a communication subsystem to receive a stream of high-speed data measurements;
   a waterfall generation subsystem to:
      receive the stream of high-speed data measurements from the communication subsystem;
      identify a plurality of changes in the stream of high-speed data;
      select a subset of data measurements from the stream of high-speed data measurements to display on the waterfall display, the subset of data measurements comprising the changes in the high-speed data;
      highlight the plurality of changes in the subset of data measurements through a plurality of modifications; and
      generate a representation of the subset of data measurements in which changes are highlighted and the subset of data measurements is presented at a rate below a perception threshold of a human operator; and
   a display subsystem to receive the representation of the subset of data measurements from the waterfall display subsystem and to display a human-perceptible waterfall display to represent the stream of high-speed data measurements and the plurality of modifications.

2. The system of claim 1, wherein the human-perceptible waterfall display comprises:
   a first portion in which each of the subset of data measurements from the stream of high-speed data measurements is consecutively displayed; and
   a second portion in which data measurements comprising changes are selectively retained while redundant measurements are selectively excluded.

3. The system of claim 1, wherein the stream of high-speed data comprises measurements from a first protective relay and a second protective relay and the human-perceptible waterfall display comprises:
   a first portion to display data measurements from the first protective relay; and
   a second portion to display data measurements from the second protective relay.

4. The system of claim 1, wherein the modification comprises one of a font size, a font color, a font style, and an overlay.

5. The system of claim 1, wherein the human-perceptible waterfall comprises a timestamp associated with changes in the stream of high-speed data.

6. The system of claim 1, further comprising a user interface to allow a user to select data displayed in the human-perceptible waterfall display.

7. The system of claim 1, wherein the high-speed data comprises a plurality of measurements of electrical conditions in an electric power system.

8. The system of claim 1, wherein the high-speed data comprises data sampled at a rate at about one million samples per second.

9. The system of claim 1, wherein the perception threshold of a human operator is less than ten measurements per second.

10. The system of claim 1, wherein the display device comprises a physically separate device.

11. A method of generating a waterfall display, the method comprising:
   receiving, using a communication subsystem, a stream of high-speed data measurements;
   identifying, using a waterfall generation subsystem to receive the stream of high-speed data measurements from the communication subsystem, a plurality of changes in the stream of high-speed data;
   selecting, using the waterfall generation subsystem, a subset of data measurements from the stream of high-speed data measurements to display on the waterfall display, the subset of data measurements comprising the changes in the high-speed data;
   highlighting, using the waterfall generation subsystem, the plurality of changes in the subset of data measurements through a plurality of modifications;
   generating, using the waterfall generation subsystem, a representation of the subset of data measurements in which changes are highlighted and the subset of data measurements is presented at a rate below a perception threshold of a human operator; and
   displaying, using a display subsystem to receive the representation of the subset of data measurements from the waterfall display subsystem, a human-perceptible waterfall display to represent the stream of high-speed data measurements and the plurality of modifications.

12. The method of claim 11, wherein the human-perceptible waterfall display comprises:
   a first portion in which each of the subset of data measurements from the stream of high-speed data measurements is displayed; and
   a second portion in which data measurements comprising changes are selectively retained while redundant measurements are selectively excluded.

13. The method of claim 11, wherein the stream of high-speed data comprises measurements from a first protective relay and a second protective relay and the human-perceptible waterfall display comprises:
   a first portion to display data measurements from the first protective relay; and
   a second portion to display data measurements from the second protective relay.

14. The method of claim 11, wherein the modification comprises one of a font size, a font color, a font style, and an overlay.

15. The method of claim 11, wherein the human-perceptible waterfall comprises a timestamp associated with changes in the stream high-speed data.

16. The method of claim 11, further comprising:
   selecting, using a user interface, data displayed in the human-perceptible waterfall display.

17. The method of claim 11, wherein the high-speed data comprises a plurality of measurements of electrical conditions in an electric power system.

18. The method of claim 11, wherein the high-speed data comprises data sampled at a rate at about one million samples per second.

19. The method of claim 11, wherein the perception threshold of a human operator is less than ten measurements per second.

20. The method of claim 11, wherein the display device comprises a physically separate device.

\* \* \* \* \*